United States Patent [19]

Lewis

[11] Patent Number: 5,361,264
[45] Date of Patent: Nov. 1, 1994

[54] MODE PROGRAMMABLE VLSI DATA REGISTERS

[75] Inventor: Edward T. Lewis, Sudbury, Mass.

[73] Assignee: Raytheon Company, Lexington, Mass.

[21] Appl. No.: 20,900

[22] Filed: Feb. 22, 1993

Related U.S. Application Data

[63] Continuation of Ser. No. 847,416, Mar. 5, 1992, abandoned, which is a continuation of Ser. No. 375,076, Jul. 3, 1989, abandoned.

[51] Int. Cl.$^5$ .......................................... G01R 31/28
[52] U.S. Cl. .................................. 371/22.5; 371/22.4
[58] Field of Search ...................... 371/22.5, 22.4, 22.3

[56] References Cited

U.S. PATENT DOCUMENTS

| | | | |
|---|---|---|---|
| 4,340,857 | 7/1982 | Fasang | 371/22.5 |
| 4,433,413 | 2/1984 | Fasang | 371/22.5 |
| 4,594,711 | 6/1986 | Thatte | 371/22.3 |
| 4,740,970 | 4/1988 | Burrows et al. | 371/22.5 |
| 4,764,926 | 8/1988 | Knight et al. | 371/22.5 |
| 4,893,311 | 1/1990 | Hunter et al. | 371/22.5 |

OTHER PUBLICATIONS

"Design and Implementation of a Hierarchical Testable Architecture Using the Boundary Scan Standard," R. T. van Riesse et al., Proceedings of the 1st European Test Conference, Apr. 12-14, Paris, pp. 112-118.

"Shift register modification for multipurpose use in combinational circuit testing," N. K. Nanda et al., Int. Journal of Electronics, 1989, vol. 66, No. 6, London, G.B., pp. 875-878.

"A Concurrent Testing Technique for Digital Circuits,"Kewal K. Saluja et al., 1988 IEEE Transactions on Computer Aided Design, vol. 7., No. 12, Dec. 1988, pp. 1250-1260.

"Design for Testability and Built-In-Self Test: A Review," H. Troy Nagle et al., IEEE Transactions on Industrial Electronics, vol. 36, No. 2, May 1989, pp. 129-140.

"Built-In Self-Test Techniques", Edward J. McCluskey, Stanford University, IEEE Design & Test of Computers, Apr. 1985, pp. 21-28.

"Built-In Self-Test Structures", Edward J. McCluskey, Stanford University, IEEE Design & Test of Computers, Apr. 1985, pp. 29-36.

"Measures of the Effectiveness of Fault Signature Analysis", James E. Smith, IEEE Transaction on Computers, vol. C-29, No. 6, Jun. 1980, pp. 510-514.

"An Advanced Fault Isolation System for Digital Logic", Norman Benowitz et al., IEEE Transaction on Computers, vol. C-24, No. 5, May 1975, pp. 489-497.

"Pseudorandom Testing", Kenneth D. Wagner, Cary K. Chin, and Edward J. McCluskey, IEEE Transaction on Computers, vol. C-36, No. 3, Mar. 1987, pp. 332-343.

"High Speed Generation of Maximal Length Sequences", Abraham Lempel, IEEE Transactions on Computers, Feb. 1971, pp. 227-229.

*Primary Examiner*—Stephen M. Baker
*Attorney, Agent, or Firm*—Walter F. Dawson

[57] ABSTRACT

Mode programmable VLSI CMOS data registers perform on-chip self-test. A first data register performs storage or transfer of data, operates in a scan mode or generates pseudo-random numbers (PRN). A second data register performs storage or transfer of data, operates in a scan mode or performs signature analysis. Data initialization of the registers occurs automatically when operating in a test mode.

2 Claims, 3 Drawing Sheets

MODE PROGRAMMABLE VLSI DATA REGISTERS

This application is a continuation of application Ser. No. 07/847,416 filed Mar. 5, 1992, which is a continuation of application Ser. No. 07/375,076, filed Jul. 3, 1989 now abandoned.

BACKGROUND OF THE INVENTION

This invention relates generally to the testing of very large scale integrated (VLSI) circuits and in particular to mode programmable data registers for performing on-chip self-test in a semiconductor device.

With the increasing complexity of VLSI chips, most modern design approaches are hierarchical and modular in concept. In such cases the chip design generally results in groups of reasonably large functional elements that are interconnected in a "pipeline" format through data storage or transfer registers. In fact the main inputs to and outputs from the chip are parallel data registers. Considering the complexity of such chips, the overall testing using the I/O ports as an interface to large commercial testers represents a formidable task.

Considering the amount of combinatorial logic being exercised in a VLSI chip and the myriad of possible fault modes, it has been estimated by many skilled in the art that millions of test generated inputs and observed outputs must be accomplished in order to state with confidence that a semiconductor chip is "good". Because of this, a great deal of attention has been given in the past few years to techniques for most optimally and efficiently testing a VLSI chip. Various techniques are described in "Built-In Self-Test Techniques" by Edward J. McCluskey, IEEE Design and Test of Computers, Vol. 2, No. 2, pp. 21–28, Apr. 1985.

One such technique involves an approach for chip "self-test". In fact, it is a modern version of a technique devised earlier and applied to module-level testing of functional elements at the printed-circuit board, or higher levels. Using this technique, a series of Pseudo-Random Numbers (PRN) is applied to a functional element or elements and the response is cumulatively observed using a process of data compression or "Signature Analysis", SA.

With respect to applying the on-chip self-test technique to testing a VLSI chip, the current approach is to include the PRN generation on the chip as well as the signature analysis (SA). These elements are designed separately, and during the chip design appropriate control logic is included so that, when in a self-test mode, the PRN can be directed to any data register and the signature analyzer can collect data from any register. Typically, PRN generators are inserted serially to data registers and SA receivers capture data either serially or in parallel. After a number of pre-determined PRN inputs and SA data compressions, the results resident in the SA receiver are compared to a previously determined (from logic simulation) "signature".

The circuits for PRNG, SA, control, and known results are generally incorporated on a section of the chip and called the "chip testability logic" (CTL). Considering the amount of secondary function the CTL must accomplish, it generally tends to consume a large fraction of the usable area on the chip (20% or greater), thereby decreasing the area available for the primary function of the chip.

SUMMARY OF THE INVENTION

In accordance with the present invention, a mode programmable data register is provided for facilitating on-chip self-test of VLSI circuits with minimum increase in useable VLSI chip areas. Such a data register includes a pseudo-random number (PRN) mode of operation or a signature analysis (SA) mode of operation in addition to a standard data stowage and transfer mode of operation and a scan mode of operation. It is an object of the invention to include the data register having a PRN mode of operation and the data register having a SA mode of operation on a VLSI chip to accomplish the on-chip self-test.

The mode programmable data register comprises a plurality of stages for storing data, each of the stages having a mode control means for enabling one of a plurality of modes, first register control means coupled to the plurality of stages for selecting a test mode or a data mode in accordance with a programmed input control signal, means coupled to an output of at least one predetermined stage of the plurality of stages for generating a feedback signal to a first one of the stages when the test mode is selected; and second register control means coupled to the first register control means and to the feedback signal generating means for selecting a scan mode of the register in accordance with a scan enable signal. The mode programmable data register further comprises automatic data initialization of the stages when operating in the test mode. In addition, each of the plurality of stages comprises logic means coupled to the output of the first register control means for selecting a data mode input or a test mode initialization input for storing in said stages. The mode programmable data register further comprises automatic data initialization of the stages when operating in the test mode.

In accordance with a further feature of the invention a method is provided for performing self-testing on a VLSI chip having a mode programmable data register comprising the steps of storing data in a plurality of stages of the data register, enabling one of a plurality of modes of the data register with mode control means, selecting a test mode or a data mode of the data register in accordance with a programmed input control signal with a first register control means coupled to the plurality of stages, generating a feedback signal to couple to a first one of the stages, when the test mode is selected, with means coupled to an output of at least one predetermined stage of the plurality of stages, selecting a scan mode of the data register in accordance with a scan enable signal using a second register control means coupled to the first register control means and to said feedback signal generating means. The step of storing data in a plurality of stages further comprises selecting a data mode input or a test mode initialization input for coupling to each of the plurality of stages with means coupled to the output of the first register control means. The step of enabling one of a plurality of modes includes a pseudo-random number generator mode of operation of the data register, and the step of enabling one of a plurality of modes includes a signature analysis mode of operation of the data register.

DESCRIPTION OF THE PREFERRED EMBODIMENT

Figure 1:
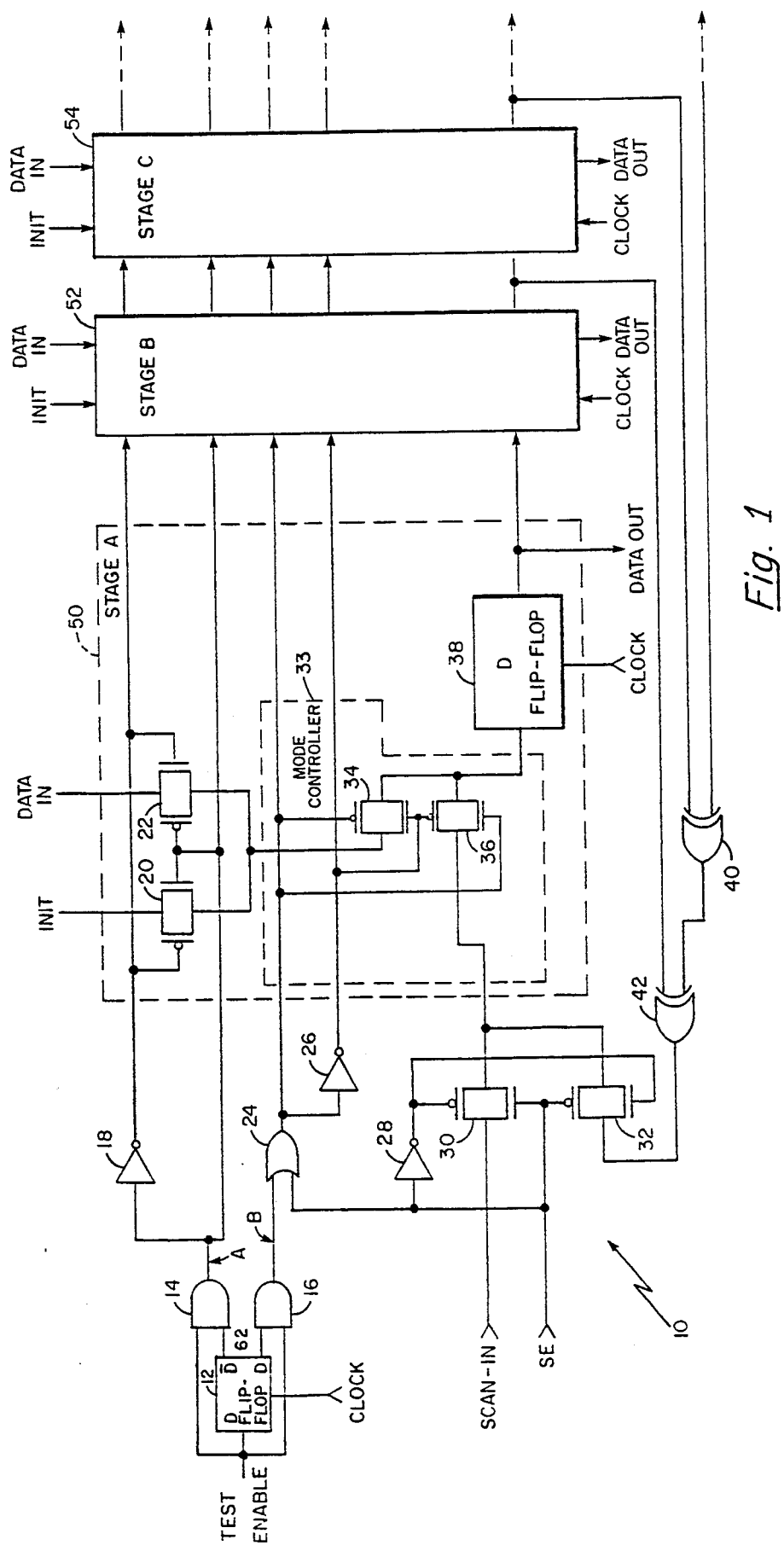
FIG. 1 is a logic/circuit diagram of the invention showing a multistage, mode programmable, multifunctional, CMOS data register comprising a pseudo-random number generator.

Referring to FIG. 1, there is shown a logic/circuit diagram of the invention comprising a mode programmable, multistage, VLSI data register 10 having a pseudo-random number (PRN) generator mode of operation determined by a mode controller 33. In addition, the data register 10 performs normal data storage or transfers data and also operates in a scan mode. A D flip-flop 38 provides the storage capability in stage A 50 and each of the succeeding stages such as stage B 52 and stage C 54 comprises the same circuitry as stage A 50.

Figure 2:
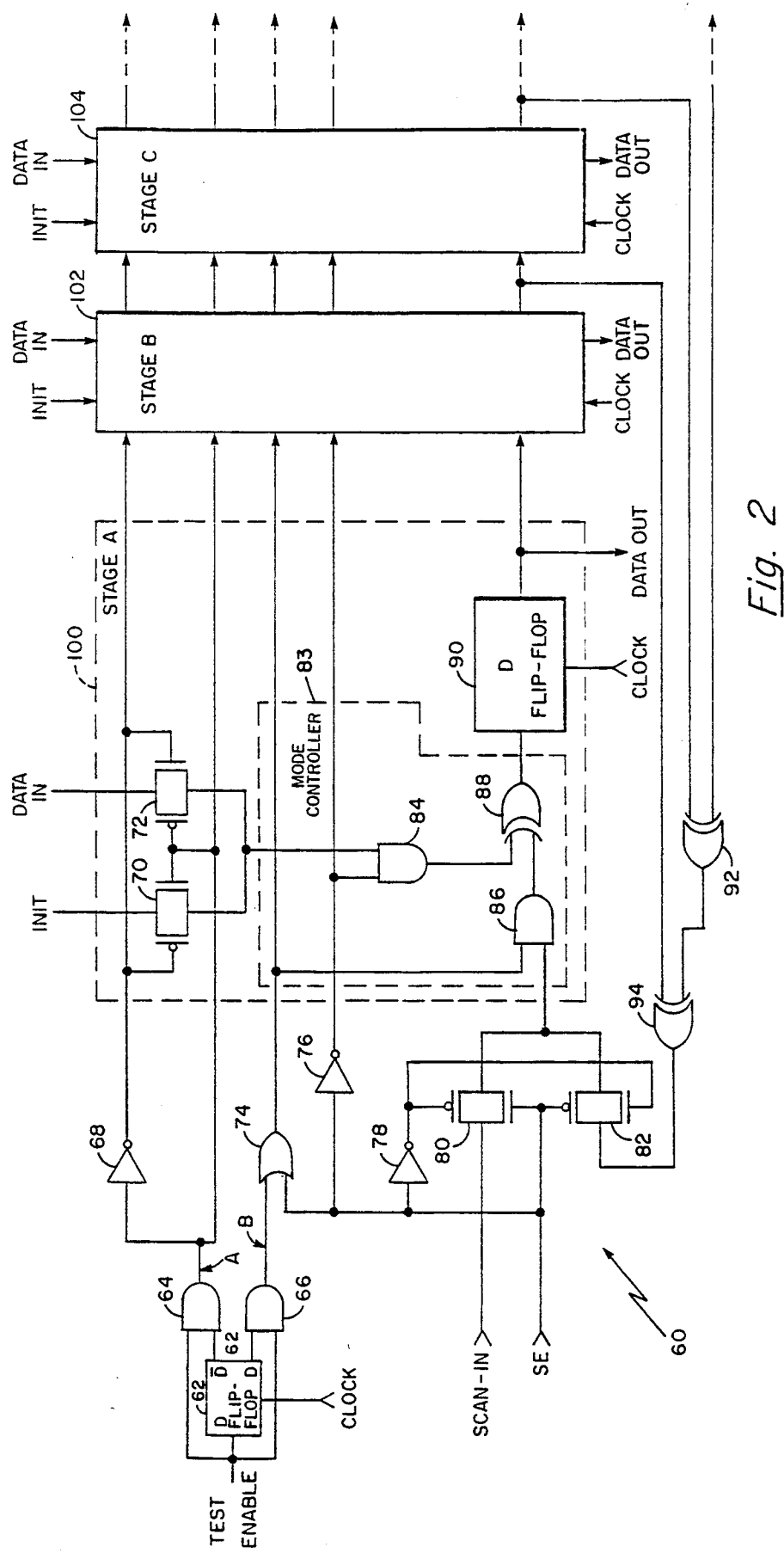
FIG. 2 is a schematic diagram of the invention showing a multistage, mode programmable, multifunctional, CMOS data register comprising a signature analysis capability.

Referring now to FIG. 2, there is shown a logic/circuit diagram of the invention comprising a mode programmable, multistage, VLSI data register 60 having a signature analysis (SA) capability in one of its modes of operation determined by a mode controller 83. In addition, the data register 60 performs normal data storage or transfers data and also operates in a scan mode. A D flip-flop 90 provides the storage capability in stage A 100 and each of the succeeding stages such as stage B 102 and stage C 104 comprises the same circuitry as stage A 100. The combination of using a plurality of mode programmable data registers 10 and mode programmable data registers 60 in place of standard data storage or transfer registers on the same semiconductor chip provides a complete on-chip self-test capability with only very minor increase in chip area for test circuitry.

Referring again to FIG. 1, data is provided to data register 10 via DATA-IN inputs. Table 1 shows the truth table for the three modes of operation for data register 10.

TABLE 1

| MODE | TEST ENABLE (TE) | SCAN ENABLE (SE) |
|---|---|---|
| Data | 0 | 0 |
| PRN | 1 | 0 |
| Scan | X | 1 |

In the data mode the test enable (TE) signal is a logic zero and the scan enable (SE) signal is a logic zero. In the pseudo-random number generator mode TE is a logic 1 and SE is a logic 0, and to be in the scan mode TE may be either a logic 1 or a logic 0 but SE must be a logic 1. Table 1 shows that while in either a test mode (PRN) or data mode, the data register 10 can be placed in a scan mode so that the contents of the data register can be shifted out to a SCAN output receiver (not shown) for observation.

Figure 3:
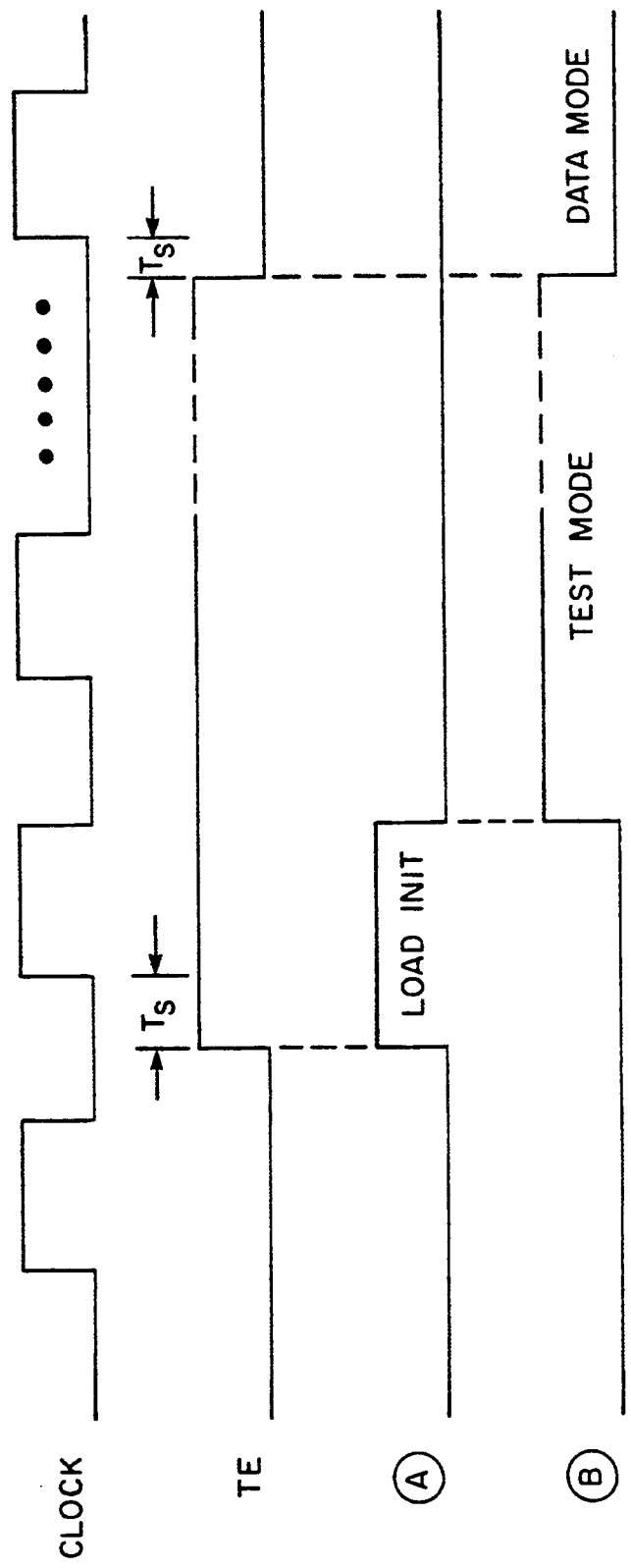
FIG. 3 is a test mode timing diagram for a multifunctional data register having a pseudo-random number generator or a signature analysis capability.

Each stage 50, 52, 54 of the data register 10 has the same circuitry comprising CMOS transmission gates 20, 22 for selecting either a test mode initialization (INIT) input or a data mode input (DATA IN) for coupling to D flip-flop 38. There is also the mode controller 33 comprising transmission gates 34, 36 for controlling the data to D flip-flop 38 depending on the selected mode of the data register 10. The control circuitry required for each data register 10 is minimal and independent of the number of stages; it comprises a D flip-flop 12 with a D/output coupled to AND gate 14 and a D output coupled to AND gate 16 for controlling the test mode operation of data register 10. The A output of AND gate 14 and the B output of AND gate 16 are shown in FIG. 3. When test enable (TE) is asserted, the DATA IN is inhibited from loading the D flip-flop 38 of each stage. Instead, D flip-flop 38 is loaded by initialization (INIT) data via transmission gate 34, by a SCAN-IN input when scan enable (SE) is asserted via transmission gate 36, or by the linear feedback exclusive-or gates 40, 42 when operating in the pseudo-random number generator mode. CMOS transmission gates 30, 32 receive the SCAN-IN, SE and linear feedback signals, and the output of these gates 30, 32 is coupled to transmission gate 36. The output of transmission gate 36 is loaded into D flip-flop 38.

Referring now to FIGS. 1 and 3, one of the most important features of the present invention is the automatic loading of the initialization (INIT) data word. Unless the pseudo-random number (PSN) generation process starts from a known state, the number generation is truly random resulting in no known expected outputs. Therefore, when the test enable (TE) signal is asserted (logic 1), while the CLOCK is low as shown in FIG. 3, the first action is to switch the input from the data mode to the test mode and to enable the initialization (INIT) input. The INIT may be hard-wired or provided by a programmable INIT data generator. The D flip-flop in each stage of the data register 10 is loaded with its respective INIT bit (0 or 1) during the first active CLOCK pulse. This action is shown in FIG. 3 together with a set-up time ($T_s$) which represents the time necessary to move the INIT data into the master section of the D flip-flop 38 (usually <5 ns). When the CLOCK goes to a logic 1 state, the INIT data is transferred to the slave portion of the D flip-flop 38, thereby establishing the data register 10 starting value. When the CLOCK returns to the logic 0 state, the pseudo-random number generator linear feedback loop is enabled. Then on the next CLOCK pulse, the PRN sequence is initiated. The PRN generator mode remains operational until TE changes to the logic 0 state when the CLOCK is low. Then the data register 10 is available to operate in the normal data mode and accept DATA IN at the next CLOCK pulse.

The use of a linear feedback shift register (LFSR) as a pseudo-random number generator for test vector generation is well known to one skilled in the art. For example, in the previously cited McCluskey reference an overview of Built-In-Self-Test (BIST) techniques is provided which describes the advantages of this approach but makes note of the added chip area required for self-test circuitry resulting in decreases in yield and reliability, but such disadvantages are overcome by the present invention.

Referring now to FIG. 2, data is provided to data register 60 via DATA-IN inputs. Table 2 shows the truth table for the three modes of operation for data register 60.

TABLE 2

| MODE | TEST ENABLE (TE) | SCAN ENABLE (SE) |
|---|---|---|
| Data | 0 | 0 |
| SA | 1 | 0 |
| Scan | X | 1 |

In the data mode the test enable (TE) signal is a logic zero and the scan enable (SE) signal is a logic 0. In the signature analysis (SA) mode TE is a logic 1 and SE is a logic 0, and to be in the scan mode, TE may be either a logic 1 or a logic 0 but SE must be a logic 1. Table 2 shows that while in either a test mode (SA) or data mode, the data register 60 can be placed in a scan mode so that the contents of the data register can be shifted out to a scan output receiver (not shown) for observation.

Each stage 100, 102, 104 of data register 60 has the same circuitry comprising CMOS transmission gates 70, 72 for selecting either a test mode initialization (INIT) input or a data mode input (DATA-IN) to D flip-flop 90 via mode controller 83 comprising AND gates 84, 86 and exclusive-or gate 88. The mode controller 83 controls the data to D flip-flop 80 depending on the selected mode of the data register 60. The control circuitry required for each data register 60 is also minimal and independent of the number of stages; it comprises D flip-flop 62 with a D/output coupled to AND gate 64 and a D output coupled to AND gate 66 for controlling the test mode operation of data register 60. The A output of AND gate 64 and the B output of AND gate 66 are shown in FIG. 3. When test enable (TE) is asserted, the DATA-IN is inhibited from loading the D flip-flop 90 of each stage 100, 102, 104. Instead D flip-flop 90 is loaded by initialization (INIT) data via transmission gate 70 coupled to AND gate 84, by a SCAN-IN input when scan enable (SE) is asserted via CMOS transmission gate 80 (which is coupled to AND gate 86 which is coupled to exclusive-or gate 88), or by the linear feedback exclusive-or gates 92, 94 when operating in the signature analysis mode. CMOS transmission gates 80, 82 receive the SCAN-IN, SE, and linear feedback signals, and the output of these gates 80, 82 is coupled to AND gate 86 which is coupled to exclusive-or gate 88.

Referring now to FIGS. 2 and 3 one of the most important features of data register 60 is the automatic loading of the initialization (INIT) data word as similarly noted hereinbefore for data register 10. Unless the signature analysis (SA) process starts from a known state, the data compression is truly random with no known expected results. Therefore, when the test enable (TE) signal is activated while the CLOCK is low as shown in FIG. 3, the first action is to switch the input from the data mode to the test mode and to enable the initialization (INIT) input. The INIT may be hard-wired or provided by a programmable INIT data generator. The D flip-flop in each stage of the data register 60 is loaded with its respective INIT bit (0 or 1) during the first active CLOCK pulse. This action is shown in FIG. 3 together with a set-up time ($T_s$) which represents the time necessary to move the INIT data into the master section of the D flip-flop 90 (usually <5 ns). When the CLOCK goes to a logic 1 state, the INIT data is transferred to the slave portion of the D flip-flop 90, thereby establishing the data register 60 starting value. When the CLOCK returns to the logic 0 state, the feedback loop is enabled. Then on the next CLOCK pulse, the SA operation is initiated. The SA mode remains operational until TE changes to the logic 0 state when the CLOCK is low. Then the data register 60 is available to operate in the normal data mode and accept DATA IN at the next CLOCK pulse.

Signature analysis is well known to one skilled in the art and discussed in the previously cited McCluskey reference. The signature to be analyzed is the bit pattern remaining in a register such as the mode programmable data register 60 after a particular bit pattern such as from a pseudo-random number generator has been applied to the VLSI circuitry under test. The most popular compression circuits employ linear feedback shift registers (LFSR).

To perform on-chip self-test of a VLSI circuit a data register 10 having a pseudo-random number (PRN) generator mode of operation is included on the VLSI chip along with a data register 60 having a signature analysis (SA) mode of operation. The PRN generator data register is typically inserted serially to data registers and the SA data register captures data either serially or in parallel. After a number of pre-determined PRN inputs and SA data compressions, the results resident in the SA register are compared to a previously determined "signature" (from logic simulation).

This concludes the description of the preferred embodiment. However, many modifications and alterations will be obvious to one of ordinary skill in the art without departing from the spirit and scope of the inventive concept. For example, the initialization (INIT) input to data registers 10, 60 may be hard-wired or provided by a programmable INIT data generator. Therefore, it is intended that the scope of this invention be limited only by the appended claims.

What is claimed is:

1. A mode programmable data register having a plurality of stages comprising:
    means having a scan input, a parallel data input and a parallel initialization input for storing data;
    means coupled to said storing means for automatically initializing said mode programmable data register to one of a plurality of predetermined states in accordance with said parallel initialization input to each stage, said initializing being performed during a first clock period of a pseudo-random number generator mode of operation following the assertion of a test enable control signal;
    means coupled to outputs of predetermined stages of said data register for enabling said register to generate pseudo-random numbers; and
    means coupled to said storing means for operating said data register in a scan mode.

2. A mode programmable data register having a plurality of stages comprising:
    means having a scan input, a parallel data input and a parallel initialization input for storing data;
    means coupled to said storing means for automatically initializing said mode programmable data register to one of a plurality of predetermined states in accordance with said parallel initialization input to each stage, said initializing being performed during a first clock period of a signature analysis mode of operation following the assertion of a test enable control signal;
    means coupled to outputs of predetermined stages of said data registers for enabling said register to perform said signature analysis; and
    means coupled to said storing means for operating said data register in a scan mode.

* * * * *